United States Patent
Yasseri et al.

(10) Patent No.: US 12,072,318 B2
(45) Date of Patent: Aug. 27, 2024

(54) CHAMBER COMPONENT CLEANLINESS MEASUREMENT SYSTEM

(71) Applicant: Lam Research Corporation, Fremont, CA (US)

(72) Inventors: Amir A. Yasseri, San Jose, CA (US); Duane Outka, Fremont, CA (US); Armen Avoyan, Oakland, CA (US); Kennet Cresencio Baylon, Pittsburg, CA (US); John Daugherty, Fremont, CA (US); Girish M. Hundi, Dublin, CA (US); Cliff La Croix, Gardnerville, NV (US)

(73) Assignee: Lam Research Corporation, Fremont, CA (US)

(*) Notice: Subject to any disclaimer, the term of this patent is extended or adjusted under 35 U.S.C. 154(b) by 247 days.

(21) Appl. No.: 17/612,381

(22) PCT Filed: May 19, 2020

(86) PCT No.: PCT/US2020/033578
§ 371 (c)(1),
(2) Date: Nov. 18, 2021

(87) PCT Pub. No.: WO2020/236803
PCT Pub. Date: Nov. 26, 2020

(65) Prior Publication Data
US 2022/0252548 A1    Aug. 11, 2022

Related U.S. Application Data

(60) Provisional application No. 62/852,185, filed on May 23, 2019.

(51) Int. Cl.
*G01N 29/14*    (2006.01)
*B08B 3/12*    (2006.01)
(Continued)

(52) U.S. Cl.
CPC ............... *G01N 29/14* (2013.01); *B08B 3/12* (2013.01); *G01N 1/02* (2013.01); *G01N 29/02* (2013.01);
(Continued)

(58) Field of Classification Search
CPC ........... B08B 3/044; B08B 3/12; B08B 3/048; B08B 3/108; H01J 37/32781;
(Continued)

(56) References Cited

U.S. PATENT DOCUMENTS 3,784,310 A * 1/1974 Barton .................. G01N 35/08
                                                   422/503
4,907,611 A * 3/1990 Shibano .................... B08B 3/12
                                                    134/108
(Continued)

FOREIGN PATENT DOCUMENTS

JP    2007-317790    12/2007
KR    2003-0043235    6/2003

OTHER PUBLICATIONS

International Search Report from International Application No. PCT/US2020/033578 dated Aug. 26, 2020.
(Continued)

*Primary Examiner* — Tran M. Tran
(74) *Attorney, Agent, or Firm* — Beyer Law Group LLP

(57) ABSTRACT

An apparatus for measuring contaminants on a surface of a component is provided. An extraction vessel for holding a measurement fluid has an opening adapted to form a meniscus using the measurement fluid. An actuator moves at least one of the extraction vessel and the component to a position where the meniscus is in contact with the surface of the component. A transducer is positioned to provide acoustic energy to the measurement fluid.

22 Claims, 8 Drawing Sheets

(51) Int. Cl.
  *G01N 1/02* (2006.01)
  *G01N 29/02* (2006.01)
  *H01J 37/32* (2006.01)
  *G01N 1/00* (2006.01)
  *G01N 1/40* (2006.01)

(52) U.S. Cl.
  CPC .. *H01J 37/32788* (2013.01); *G01N 2001/002* (2013.01); *G01N 2001/4094* (2013.01)

(58) Field of Classification Search
  CPC ............. H01J 37/3288; H01J 37/32853; H01J 37/32788; G01N 2015/0053; G01N 15/06; G01N 29/046; G01N 2015/1272; G01N 15/0637; G01N 29/028; G01N 2001/1031; G01N 2001/1037; B01J 19/10; H01L 21/67051
  See application file for complete search history.

(56) References Cited

U.S. PATENT DOCUMENTS

| | | | | |
|---|---|---|---|---|
| 5,834,625 | A | 11/1998 | Kraus, Jr. et al. | |
| 5,931,173 | A | 8/1999 | Schiele | |
| 6,039,059 | A * | 3/2000 | Bran | B06B 3/00 134/147 |
| 6,106,590 | A * | 8/2000 | Ueno | B01D 19/0078 95/266 |
| 6,238,487 | B1 * | 5/2001 | Jenkins | H01L 21/02052 257/E21.228 |
| 6,494,964 | B1 * | 12/2002 | Jacobs | A61L 2/28 134/25.4 |
| 6,624,078 | B1 * | 9/2003 | Ravkin | H01L 22/34 438/758 |
| 6,689,418 | B2 * | 2/2004 | Olgado | B08B 3/048 427/353 |
| 6,693,443 | B2 * | 2/2004 | Ludwig | G01N 15/12 75/375 |
| 6,776,851 | B1 * | 8/2004 | Singh | C23C 16/4405 438/719 |
| 6,810,887 | B2 * | 11/2004 | Tan | C11D 11/0047 134/2 |
| 6,994,769 | B2 * | 2/2006 | Singh | C23C 16/4405 156/345.35 |
| 7,004,016 | B1 * | 2/2006 | Puskas | G01N 29/348 73/64.53 |
| 7,155,963 | B2 * | 1/2007 | Nishioka | B08B 13/00 73/104 |
| 7,563,329 | B2 * | 7/2009 | Lin | A61L 2/183 356/237.2 |
| 7,900,640 | B2 * | 3/2011 | Eshima | B08B 3/048 134/186 |
| 8,327,861 | B2 * | 12/2012 | Yin | H01L 21/67086 134/94.1 |
| 8,404,056 | B1 | 3/2013 | Chen et al. | |
| 8,863,763 | B1 * | 10/2014 | Chen | B08B 3/12 134/113 |
| 9,575,022 | B2 * | 2/2017 | Bommarito | G01N 27/22 |
| 10,081,036 | B2 * | 9/2018 | Bhoyar | G01N 15/0618 |
| 10,453,709 | B2 * | 10/2019 | Wang | B08B 3/14 |
| 10,537,891 | B2 * | 1/2020 | Egeler | C12M 1/00 |
| 10,583,465 | B2 * | 3/2020 | Wang | B08B 3/12 |
| 10,712,267 | B2 * | 7/2020 | Kawasaki | G01N 15/06 |
| 10,875,059 | B2 * | 12/2020 | Bauer | B08B 3/12 |
| 10,967,407 | B2 * | 4/2021 | Yasseri | B08B 3/12 |
| 11,192,153 | B2 * | 12/2021 | Bhoyar | G01N 15/0618 |
| 2002/0142617 | A1 * | 10/2002 | Stanton | G01N 21/9501 257/E21.228 |
| 2003/0098040 | A1 | 5/2003 | Nam et al. | |
| 2004/0016442 | A1 * | 1/2004 | Cawlfield | H01L 21/67057 134/102.1 |
| 2004/0238005 | A1 * | 12/2004 | Takayama | H01L 21/67057 134/2 |
| 2005/0087209 | A1 | 4/2005 | Nicolosi, Jr. et al. | |
| 2007/0272545 | A1 | 11/2007 | Miyagi | |
| 2008/0289971 | A1 * | 11/2008 | Shigihara | A61L 2/035 205/687 |
| 2010/0078043 | A1 * | 4/2010 | Kitabata | H01L 21/67057 134/10 |
| 2012/0216833 | A1 * | 8/2012 | Wang | H01L 21/67288 134/109 |
| 2016/0056061 | A1 * | 2/2016 | Wang | H01L 21/67051 134/113 |
| 2018/0128733 | A1 * | 5/2018 | Goradia | B01L 3/502715 |

OTHER PUBLICATIONS

Written Opinion from International Application No. PCT/US2020/033578 dated Aug. 26, 2020.
Taiwanese Office Action from Taiwanese Application No. 109116892, Oct. 18, 2023 with English Translation.
Taiwanese Decision of Refusal from Taiwanese Application No. 109116892, Jun. 7, 2024 with Machine Translation.

* cited by examiner

CHAMBER COMPONENT CLEANLINESS MEASUREMENT SYSTEM

CROSS-REFERENCE TO RELATED APPLICATION

This application claims the benefit of priority of U.S. Application No. 62/852,185, filed May 23, 2019, which is incorporated herein by reference for all purposes.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

The disclosure relates to a method and system for measuring the cleanliness of a component. More specifically, the disclosure relates to a method and system for measuring the cleanliness of a component for use in a wafer plasma processing chamber.

In forming semiconductor devices, wafer plasma processing chambers are used to process substrates. Some plasma processing chambers have components, such as dielectric power windows, gas injectors, edge rings, electrodes, showerheads, high flow liners, and electrostatic chucks. To reduce defects, the components must be clean.

An example of a conventional device to measure the cleanliness of a component is an airborne particle counter with a specialized head where, for example, pressurized air jets on the outside of the head blow inwardly over the surface. At the center of the head is a vacuum inlet where particles are essentially sucked off the surface and transported to an aerosol particle counter. Although the device is extremely portable and any flat surface can be measured, this device has disadvantages. The accuracy of the measurement is affected by the environment around the object under test. The test is only limited to flat surfaces that are within the line of sight. Not all particles from the surface may be removed and counted due to the fact that the probe is handheld. These characteristics will affect the particle count levels and yield a method that is not as sensitive.

Alternatively, there have also been some conventional bulk liquid-based sampling techniques to extract the particles from components through more efficient surface sampling methods using ultrasonics or mechanical agitation in tanks, liners, and bags. The liquid from the ultrasonic tanks, liners, and bags is analyzed. Techniques that aim to sample large surface areas in sonic assisted baths or agitating bags are not ideal, because such techniques lack detection sensitivity and resolution from the analysis method due to significant background noise that exists in the setup. In addition, the higher background noise may cause saturation of the counter, reducing sensitivity.

SUMMARY

To achieve the foregoing and in accordance with the purpose of the present disclosure, an apparatus for measuring contaminants on a surface of a component is provided. An extraction vessel for holding a measurement fluid has an opening adapted to form a meniscus using the measurement fluid. An actuator moves at least one of the extraction vessel and the component to a position where the meniscus is in contact with the surface of the component. A transducer is positioned to provide acoustic energy to the measurement fluid.

In another manifestation, a method for measuring contaminants on a surface of a component is provided. An extraction vessel is filled with measurement fluid. A meniscus is formed using the measurement fluid at an opening in the extraction vessel. At least one location on the surface of the component is contacted with the meniscus. Acoustic energy is provided to the measurement fluid. An amount of contaminants in the measurement fluid is measured.

These and other features of the present disclosure will be described in more detail below in the detailed description of the disclosure and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION OF EMBODIMENTS

Figure 1A:
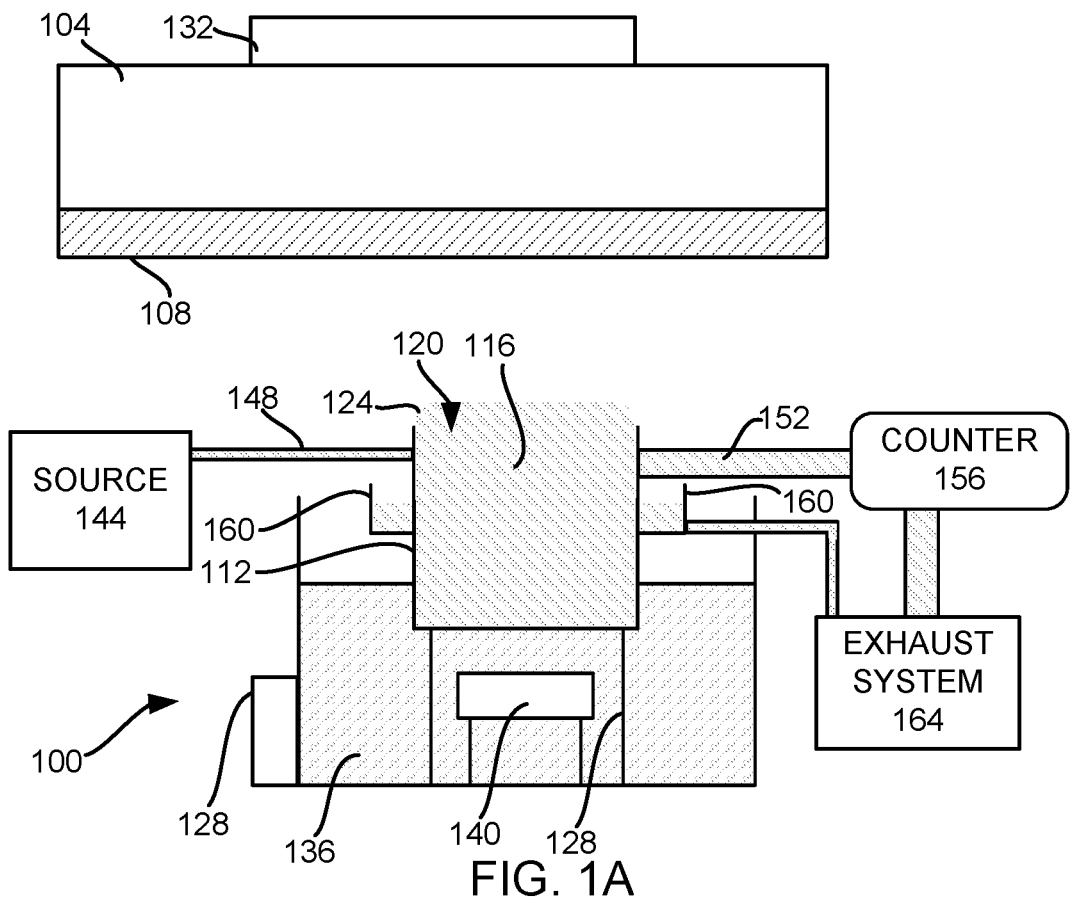
FIGS. 1A-F are schematic views of an embodiment.

The present disclosure will now be described in detail with reference to a few preferred embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well-known process steps and/or structures have not been described in detail in order to not unnecessarily obscure the present disclosure.

Semiconductor fabrication equipment process modules, including etch, strip, clean, and deposition tools, use critical chamber hardware components. Critical chamber hardware components are fabricated into various shapes, sizes, and geometries that are made from poly-crystalline ceramic materials such as alumina and/or alumina with zirconia and yttria-based coatings. Other hardware materials may include silicon, quartz, aluminum, and anodized aluminum. These materials when fabricated into components can often be loaded with numerous sources of surface contaminants. The surface contaminants include organic residues, inorganic metallic/ionic impurities, and particles that manifest themselves as loosely-bound solids that vary in morphology and sizes ranging from hundreds of microns to submicron down to tens of nanometers. These particles are highly undesirable and either can load on to the material during component fabrication machining processes for example (grinding, lapping, polishing). In addition, these particles are also inherently built into the bulk top-layer surface morphology as a byproduct of the coating process. Submicron and nano-sized particle loading on any etch, deposition, or clean module component prior to or upon installation must be avoided to ensure that process qualification with particle monitoring generally being measured down to 28 nm to be successful. Otherwise, unclean components will inevitably lead to numerous defect issues on the wafer upon the initial startup of a process module. This causes an adverse and unwanted impact on the startup time, product yield, and overall productivity.

With these challenges in mind, critical surfaces of newly fabricated critical chamber components must be cleaned with higher precision using a robust cleaning method that not only targets the removal of larger micron-sized particles but also eliminates all undesirable small sized particles from tens of nanometers to tens of microns. Critical surfaces are surfaces of a component that are exposed to a process plasma (plasma facing surfaces), where such exposure could create contaminants and cause defects. Critical surfaces may be ceramic surfaces, such as alumina and/or alumina with zirconia and yttria. Measurement systems must be able to confirm that a component has been cleaned to desired specifications.

In order to determine if components have been cleaned to desired specifications, a method and system would be desirable to measure the cleanliness of a component during the cleaning processes and/or prior to chamber component installations. Considering the large dimensions and geometry of some common critical components, such as transformer coupled plasma (TCP) windows, high flow liners, pinnacles, and showerheads, accessibility to the chamber critical coatings on these component surfaces is extremely difficult. Conventional surface-sensitive analytical techniques that sample for particle cleanliness on components are difficult to rely on unless there are significant efforts made to modify instrumentation to allow the capability to run such analysis on these large components.

An example of a conventional device is an airborne particle counter with a specialized head where, for example, pressurized air jets on the outside of the head blow inwardly over the surface. At the center of the head is a vacuum inlet where particles are essentially sucked off the surface and transported to an aerosol particle counter. This method has some unique advantages in that the device is extremely portable and any flat surface can be measured. However, obvious disadvantages are that the accuracy of the measurement is affected by the environment around the object under test, the test is only limited to line of site flat surfaces, not all particles from the surface may be removed and counted due to the fact that the probe is handheld, the speed at which the surface is scanned, the localized flow velocity is too small and interfacial forces bounding the small particles too large, as well as the planarity of the probe to the surface. These characteristics will affect the particle count levels and yield a method that is not as sensitive.

Alternatively, there have also been some conventional bulk liquid-based sampling techniques to extract the particles from components through more efficient surface sampling methods using ultrasonics or mechanical agitation in tanks, liners, and bags. The liquid from the ultrasonic tanks, liners, and bags is analyzed. Techniques that aim to sample large surface areas in sonic assisted baths or agitating bags are not ideal, because such techniques lack detection sensitivity and resolution from the analysis method due to a significant background noise that exists in the setup. In addition, the higher background noise may cause saturation of the counter, reducing sensitivity. The need for higher sensitivity and resolution is caused by several reasons. One reason is that a significant amount of signal from background contributions (i.e. non-critical surfaces of the component, bag, fixtures, environment) can occur during the sampling process. If a minute amount of particle contamination from the material is to be detected from a large component by rinsing or immersing the component, that signal is often lost or convoluted in this noise. Other reasons may be because of the inefficiency and lack of on part spatial resolution of the sample extraction and/or recovery technique. If the material is chemically inert or strongly adhered (thereby resulting in poor extraction efficiency), it makes analysis complicated and oftentimes extremely challenging. Moreover, the same characteristics also limit follow up validations of surface cleanliness because of the inefficiency to remove the particles during sampling.

An embodiment provides an off-chamber method and system to sample critical surfaces of large chamber components during the final stages of a precision cleaning process prior to final rinsing, drying, and baking to ensure the components are compliant in terms of particle cleanliness defects. An embodiment provides a Meniscus Acoustic Pulse Liquid Particle Count scan analysis (MAP LPC). An embodiment provides an apparatus that allows for selective area sampling of only the critical surfaces on chamber components via a controlled liquid meniscus interface. The setup offers a superior level of analytical control that overcomes some common limitations associated with conventional sampling methods previously described using a liquid particle counter (LPC). This embodiment allows controlled area scanning via a defined meniscus for spot extraction and use of an acoustic pulse as an excitation source to dislodge and sample more strongly adhered particle surface contaminants. The contaminants are extracted into a clean working fluid that is to be analyzed.

An embodiment is designed to achieve and maintain low particle baseline counts within an isolated clean sampling apparatus. This method avoids using large tank overflow sampling schemes, where the measurement of noncritical surfaces come into play. These non-critical areas contribute to high particle count backgrounds in the measurement and thereby cause issues with instrument saturation, sample to sample variability, and convolution of data often making analysis difficult to interpret. Inevitably, measurements of critical surfaces sampled by this embodiment equipped with acoustic pulse sources provide improved results over those yielded by conventional analytical tank LPC and sonication extraction setups and practices. This unique characteristic allows an operator to monitor, diagnose, and validate the cleanliness of the critical surfaces of large components that have been already precision cleaned. Employing this method comprising a process for creating a meniscus, sampling, and analyzing can reproducibly validate superior cleaned yielded components that exhibit extremely low residual particle levels with assurance.

To facilitate understanding, FIG. 1A is a schematic view of an embodiment. In this embodiment, a measurement system 100 is used to measure the cleanliness of a component 104 with a critical surface 108. An extraction vessel 112 is adapted to hold a measurement fluid 116. In this embodiment, the measurement fluid 116 is deionized water (DIW). The extraction vessel 112 has an opening 120 adapted to form a convex meniscus 124 from the measurement fluid 116. A vessel actuator 128 is connected to the extraction vessel 112. A component actuator 132 is connected to the component 104. The vessel actuator 128 and component actuator 132 are used to move the extraction vessel 112 and component 104 relative to each other in order to allow the meniscus 124 and the component 104 to make surface contact in a reproducibly controlled way to measure the cleanliness of the critical surface 108 of the component 104. In this embodiment, the extraction vessel 112 is situated in a fluid bath 136. A transducer 140 is also situated in the fluid bath 136.

A measurement fluid source 144 is pre-processed and provides clean measurement fluid 116 to the extraction vessel 112 through an input line 148. The pre-processed measurement fluid 116 may be pre-conditioned by ultrafiltration. A measurement line 152 draws measurement fluid 116 from the extraction vessel 112 and provides the measurement fluid 116 to a sampling collection station connected to a liquid particle count scan analysis counter device (liquid particle counter (LPC) device) 156. The overflow of measurement fluid 116 from the extraction vessel 112 is collected in a gutter 160. Measurement fluid 116 from the gutter 160 and the LPC device 156 is provided to an exhaust system 164.

Figure 2:
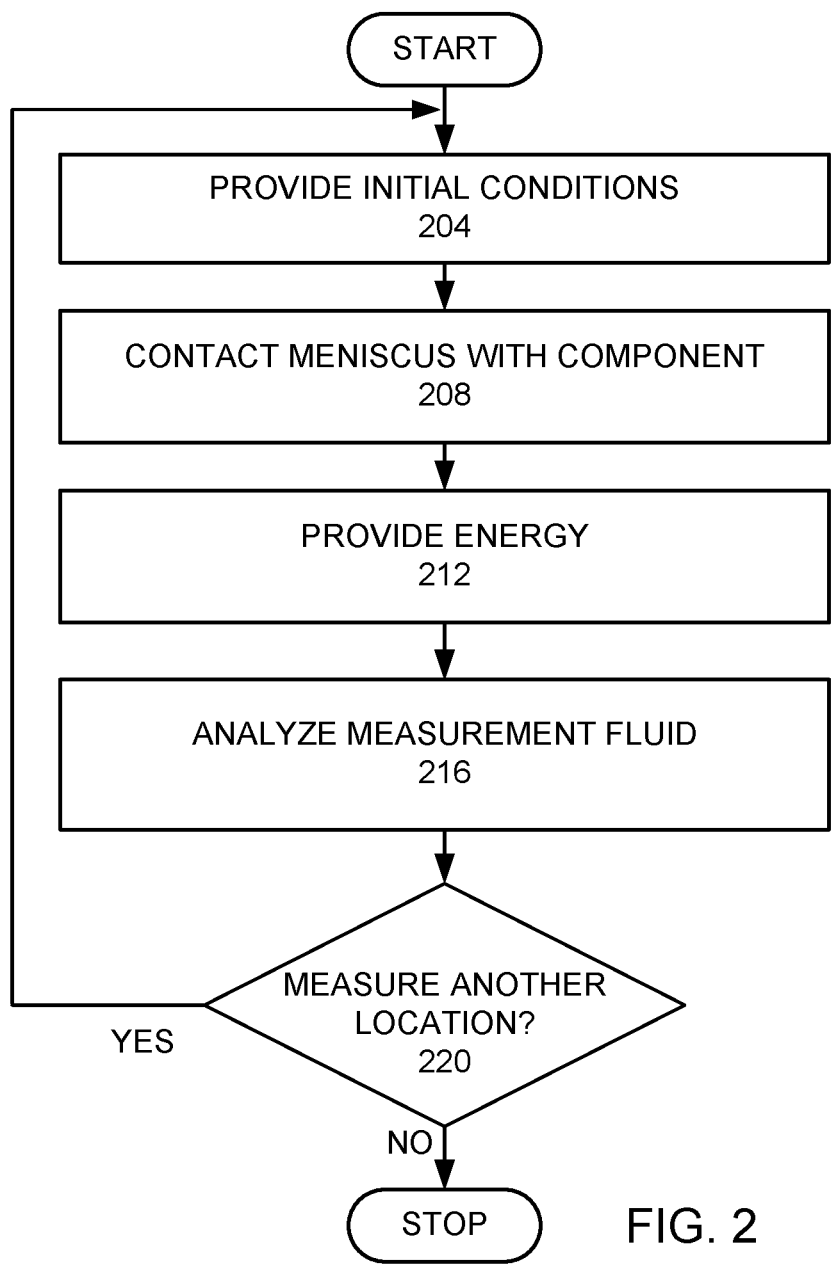
FIG. 2 is a high level flow chart of an embodiment.

FIG. 2 is a high level flow chart of an embodiment for measuring the cleanliness of the critical surface 108 of the component 104. First, initial conditions are provided (step 204). An initiation process may be used to purge and refill measurement fluid 116. The purging may provide fluid from the measurement fluid source 144 to fill the extraction vessel 112, causing measurement fluid 116 to overflow through the opening 120 of the extraction vessel 112 and drain to the gutter 160 for some period to pre-flush the extraction vessel 112. Measurement fluid 116 in the gutter 160 flows to the exhaust system 164. The purging may continue until samples collected from the extraction vessel 112 and analyzed by the LPC 156 counts a baseline amount of contaminant in the measurement fluid 116. In this example, the amount of contaminant is measured as the concentration of contaminant in the measurement fluid 116. The baseline contaminant concentration may be achieved by continuously purging the measurement fluid 116 until a minimum particle contaminant count concentration is reached, if an analyzer is in-line or by counting the particle concentration after a set initiation process is completed. Once the initial conditions have been established, a meniscus 124 of the measurement fluid 116 can be created at the opening 120 of the extraction vessel 112.

After the initial conditions are provided (step 204) for the extraction vessel 112, contact is established between a clean meniscus 124 and the critical surface 108 of the component 104 (step 208). The vessel actuator 128 and component actuator 132 are used to move the extraction vessel 112 and/or the component 104 relative to each other in order to allow the meniscus 124 to contact a location on the critical surface 108 of the component 104, without the extraction vessel 112 contacting the component 104. In an embodiment, only the component 104 is moved. In another embodiment, only the extraction vessel 112 is moved. In another embodiment, the meniscus 124 is created after the extraction vessel 112 and component 104 are placed in proper positions relative to each other.

Figure 1B:
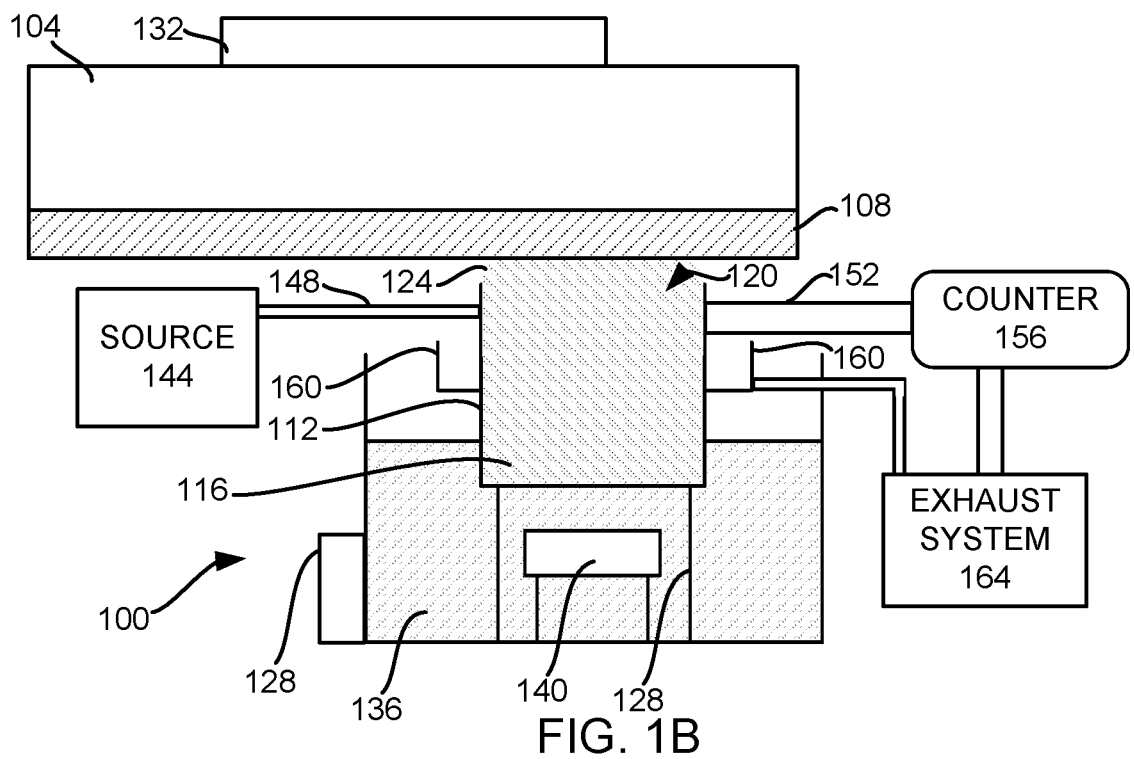

FIG. 1B is a schematic view of the measurement system 100 after the component 104 has been moved with respect to the extraction vessel 112 so that the meniscus 124 is in contact with a location on the critical surface 108 of the component 104. The extraction vessel 112 is spaced apart from the critical surface 108, preventing the extraction vessel 112 from contaminating and/or damaging the critical surface 108. In addition, a seal is not applied between the extraction vessel 112 and the critical surface 108. A seal would be an additional source of contamination of or damage to the critical surface 108.

After the meniscus 124 is placed in contact with a location on the critical surface 108, energy is provided (step 212). In this embodiment, ultrasonic or megasonic energy is provided by the transducer 140 as acoustic energy. The ultrasonic or megasonic energy provides sonication energy.

Figure 1C:
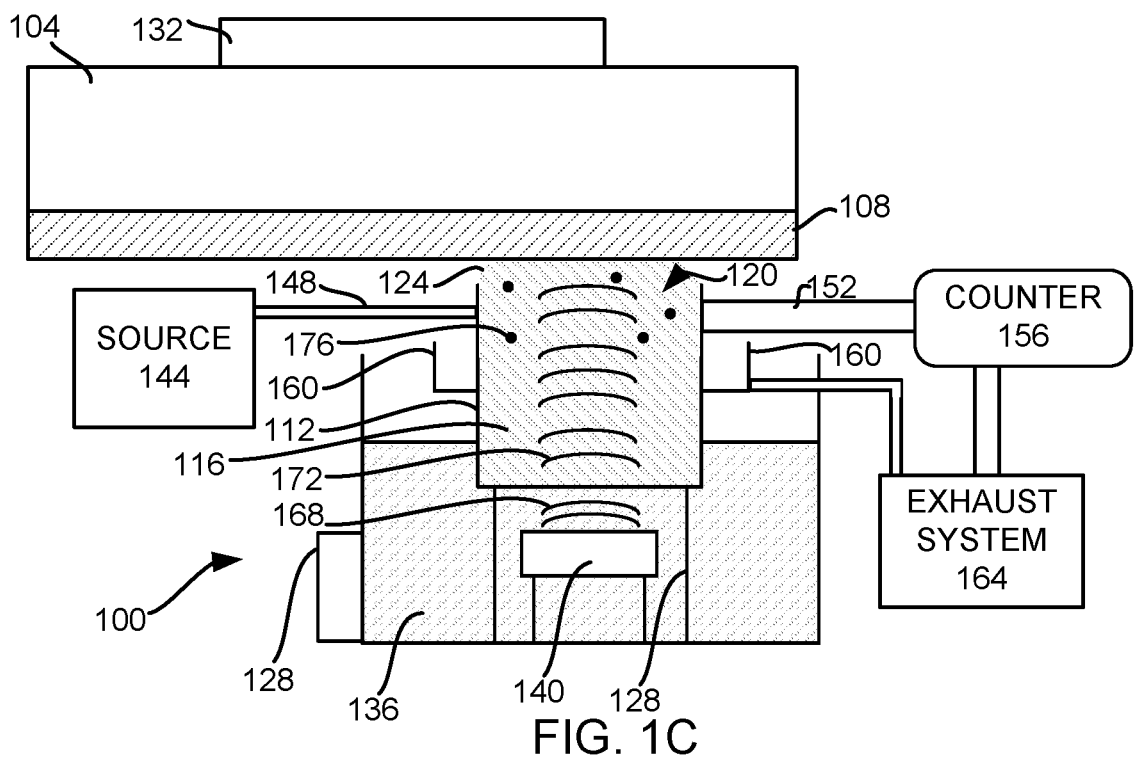

FIG. 1C is a schematic view of the measurement system 100, as ultrasonic or megasonic energy 168 is provided by the transducer 140 to the fluid bath 136. Since the fluid bath 136 is in contact with the extraction vessel 112, the ultrasonic or megasonic energy 168 is transferred to the measurement fluid 116, providing ultrasonic or megasonic energy 172 to the measurement fluid 116. The ultrasonic or megasonic energy 172 causes contaminant particles 176 to be dislodged from the critical surface 108 into the measurement fluid 116.

Figure 1D:
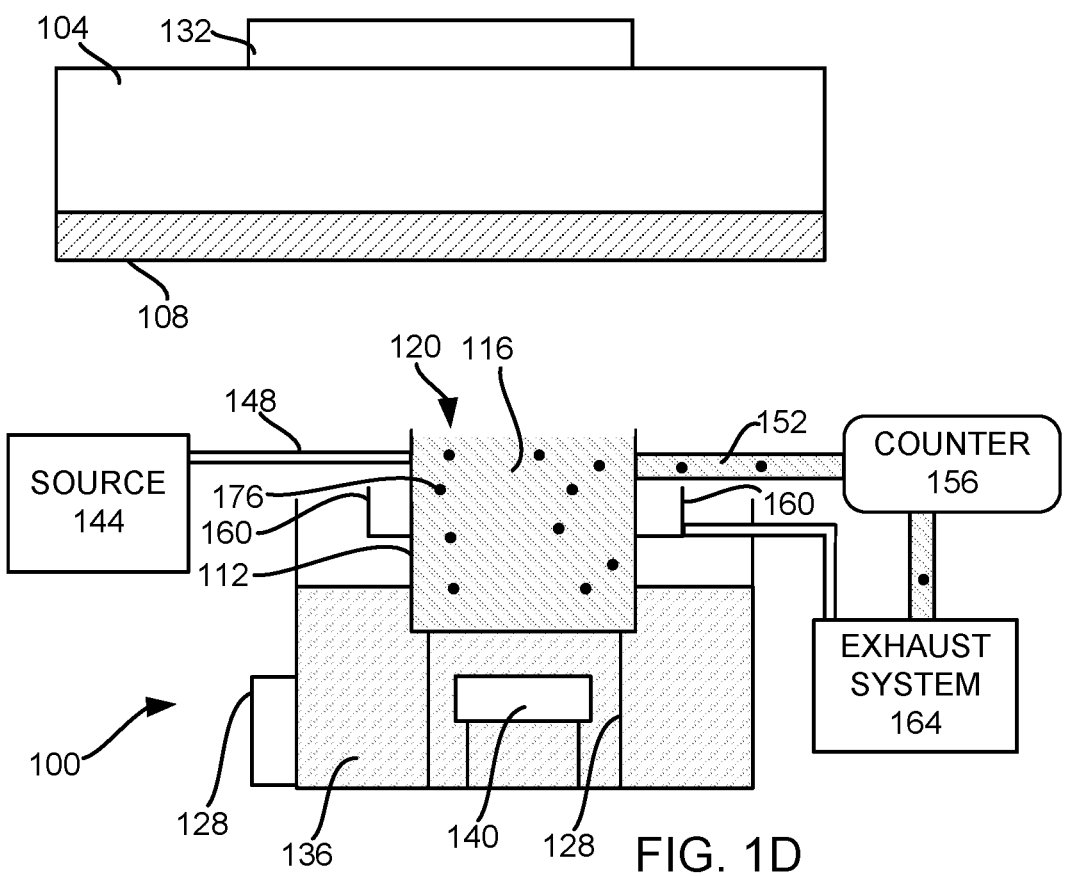

After energy is provided (step 212), the measurement fluid 116 is analyzed (step 216). In this embodiment, the acoustic energy is stopped either before or after the extraction vessel 112 and/or the component 104 are moved relative to each other so that the meniscus 124 is not in contact with the critical surface 108. FIG. 1D is a schematic view of the measurement system 100 during the analysis of the measurement fluid 116. Measurement fluid 116 is flowed from the extraction vessel 112 through the measurement line 152 to the sampling station equipped with LPC device 156. The LPC device 156 is able to count the concentrations of contaminant particles 176 in order to determine the level of cleanliness of the component 104. The LPC device 156 can determine the size of the particles present in the measurement fluid 116 and determine the distribution of the different sizes found. The type of particles can be determined by an alternative technique of collecting aliquots of the measurement fluid 116 through a separate fine filter and analyzing their composition through other techniques offline. The LPC device 156 can detect submicron to micron-sized particles 0.1 um up to several microns.

After the measurement fluid 116 is analyzed (step 216), a determination may be made to determine if another measurement at the same location or another location will be made (step 220). If another measurement is to be made, initial conditions are provided (step 204). To establish the initial conditions, an initiation process may be used to purge and refill measurement fluid 116 to remove contaminant particles 176. The purging may provide fluid from the measurement fluid source 144 to fill the extraction vessel 112, causing measurement fluid 116 to overflow through the opening 120 of the extraction vessel 112 and drain to the gutter 160. In other embodiments, the fluid from the source 144 may also flow through a extraction vessel drain port line feeding a sampling vessel to purge out any dead volume left behind in that line from a prior measurement. Measurement fluid 116 in the gutter 160 flows to the exhaust system 164. The purging may continue until the sample sent to the LPC device 156 or a sampling collection vessel counts a baseline contaminant concentration of the measurement fluid 116. The baseline contaminant concentration may be achieved by purging the measurement fluid 116 until a contaminant concentration is below a threshold or by measuring concentration after a process is completed. Once the initial conditions have been established, a meniscus 124 of the measurement fluid 116 can be created at the opening 120 of the extraction vessel 112.

After the initial conditions are provided (step 204), contact is created between the meniscus 124 and the critical surface 108 of the component 104 (step 208). The vessel actuator 128 and the component actuator 132 are used to move the extraction vessel 112 and/or the component 104 relative to each other to allow the meniscus 124 to contact a location on the critical surface 108 of the component 104, without the extraction vessel 112 contacting the component 104. The meniscus 124 is in contact with a location of the critical surface 108 that is different than the location of the critical surface 108 previously measured.

Figure 1E:
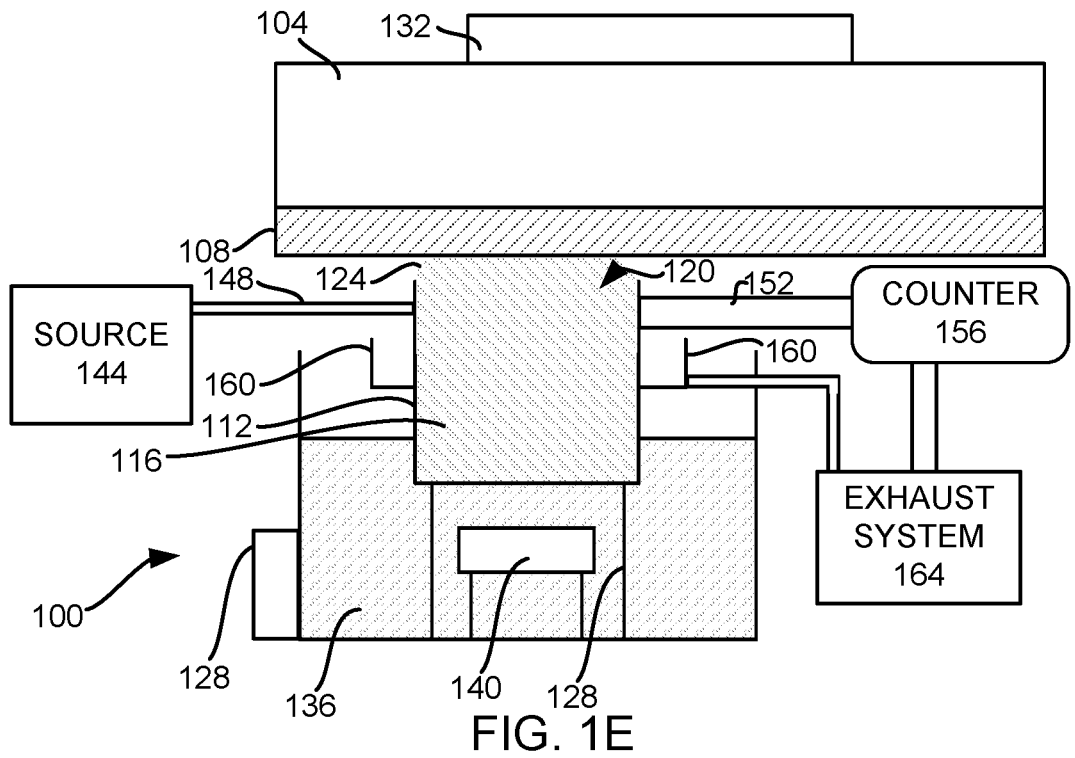

FIG. 1E is a schematic view of the measurement system 100 after the component 104 has been moved with respect to the extraction vessel 112 so that the meniscus 124 is in contact with a location on the critical surface 108 of the component 104. In an alternate embodiment, a vessel with a confined meniscus can be moved or scan in any direction (x-y-z) relative to the component surface in order that the meniscus 124 is in contact with a different location of the critical surface 108 of the component. It should be noted that the meniscus 124 is in contact with a different location of the critical surface 108 than the location of contact between the meniscus 124 and the critical surface 108, shown in FIG. 1B.

After the meniscus 124 is placed in contact with a location on the critical surface 108, acoustic energy is provided (step 212). In this embodiment, ultrasonic or megasonic energy is provided by the transducer 140. The ultrasonic or megasonic energy provides sonication energy.

Figure 1F:
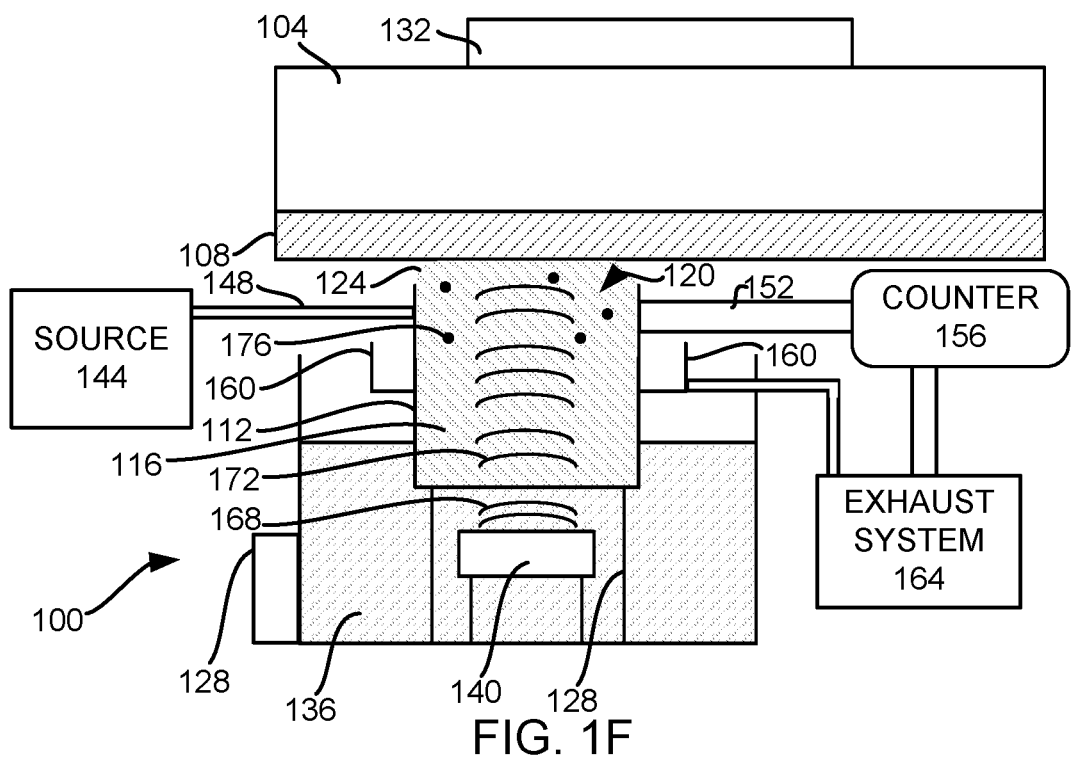

FIG. 1F is a schematic view of the measurement system 100, as ultrasonic or megasonic energy 168 is provided by the transducer 140 to the fluid bath 136. Since the fluid bath 136 is in contact with the extraction vessel 112, the ultrasonic or megasonic energy 168 is transferred to the measurement fluid 116, providing ultrasonic or megasonic energy 172 to the measurement fluid 116. The ultrasonic or megasonic energy 172 causes contaminant particles 176 to be extracted from the critical surface 108 into the measurement fluid 116.

After energy is provided (step 212), the measurement fluid 116 is analyzed (step 216). In this embodiment, the acoustic energy is stopped either before or after the extraction vessel 112 and/or the component 104 are moved relative to each other so that the meniscus 124 is not in contact with the critical surface 108. Measurement fluid 116 is flowed from the extraction vessel 112 through the measurement line 152 to LPC device 156 The LPC device 156 is able to count the concentrations of contaminant particles 176.

After the measurement fluid 116 is analyzed (step 216), a determination may be made to determine if another measurement at another location will be made (step 220). The cycle is repeated until a sufficient number of samples of the critical surface 108 are tested. Then the process may be stopped and analyses of the separate locations may be used to estimate the cleanliness of the entire critical surface 108.

Figure 3:
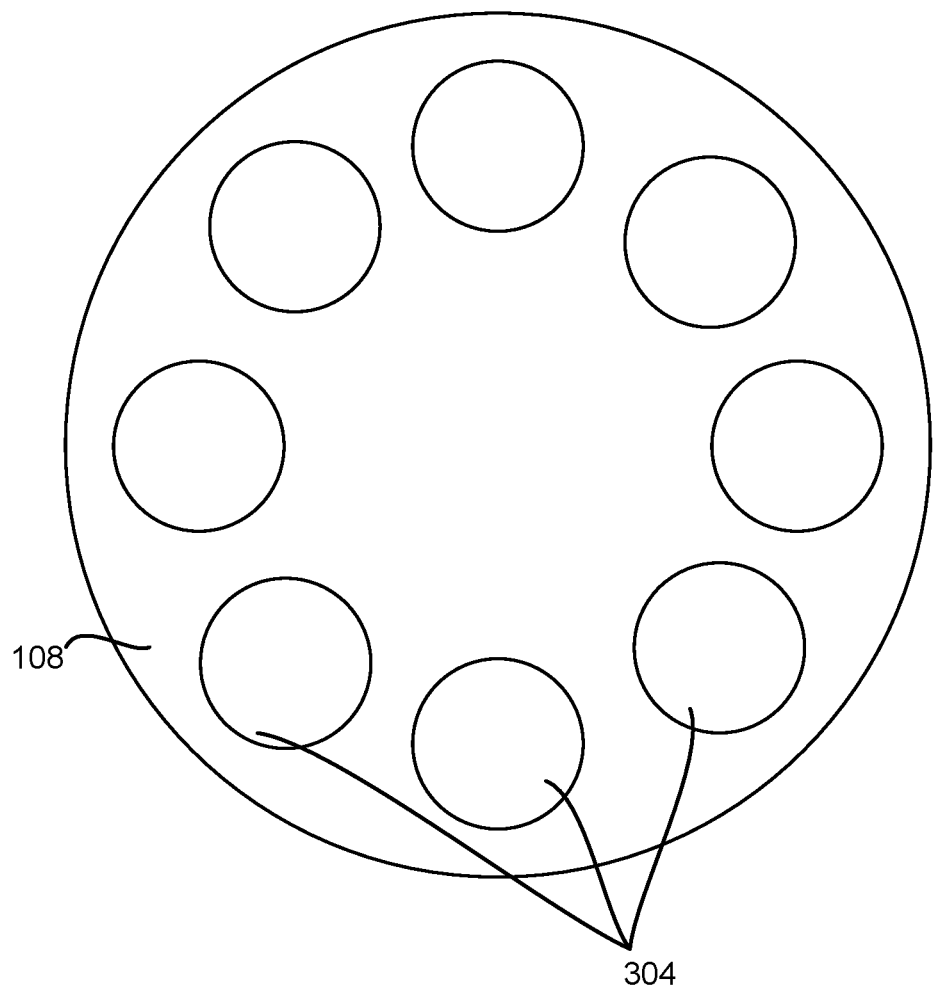
FIG. 3 is a schematic bottom view of a critical surface tested according to an embodiment.

FIG. 3 is a bottom view of the critical surface 108. In this example, the critical surface 108 has a circular cross-section. In this example, eight test locations 304 are tested using the above process. In this example, the component actuator 132 would rotate the critical surface 108. The extraction vessel 112 can also be moved relative to the component 104 to sample anywhere along the radius of the component 104.

Various embodiments allow for testing of large components 104 and/or large critical surfaces 108. Either the component 104 or the extraction vessel 112 or both may be moved to provide the relative positioning between the component 104 and extraction vessel 112. In various embodiments, only the meniscus 124 contacts the critical surface 108. Therefore, the critical surface 108 is not contaminated or damaged by contact with the measurement system 100. Contact of the critical surface 108 with part of the measurement system 100, such as the extraction vessel 112, would cause rubbing, fretting, between the measurement system 100 and the critical surface 118, resulting in the creation of contaminant particles. In an alternative embodiment, a seal is formed between the extraction vessel 112 and the critical surface 108. The seal is made from a material that is extremely clean and does not damage the component 104 by surface to surface contact.

In various embodiments, the measurement fluid 116 does not contact non-critical surfaces of the component 104. Non-critical surfaces of the component 104 are surfaces that will not contact plasma during processing. Non-critical surfaces may form exterior surfaces of a plasma processing chamber. A significant characteristic of non-critical surfaces of component 104 is that the non-critical surface does not need to be cleaned and validated to the same level that critical surfaces need to be. If the non-critical surface is on the outside of a plasma processing chamber, then contaminants on the non-critical surface will not contaminate the plasma within the plasma processing chamber. As a result, the non-critical surface does not need to be cleaned to the extent that the critical surface 108 is cleaned. Since the non-critical surface is not as clean, if the measurement fluid 116 contacts the non-critical surface, contaminants from the non-critical surface will cause the measurement system 100 to be less sensitive to the lower concentration of contaminants from the critical surface 108, yielding poor resolution. In addition, since the entire component 104 is not placed in the extraction vessel 112, the extraction vessel 112 and volume of measurement fluid 116 can be small, even when used to test large components 104.

Various embodiments may have various combinations of frequencies of ultrasonic or megasonic energy 168. In one embodiment, the acoustic energy provided comprises two ultrasonic signal frequencies of a first frequency of 200 kilohertz (kHz) and a second frequency of 430 kHz and a megasonic signal frequency of a third frequency of 1 megahertz (MHz). In one embodiment, only the first frequency is used. In another embodiment, only the second frequency is used. In another embodiment, only the third frequency is used. In another embodiment, two or more frequencies are provided simultaneously. In another embodiment, two or more frequencies are provided sequentially. In other embodiments, other combinations of frequencies and time sequences may be used. In other embodiments, the acoustic energy provided comprises ultrasonic signal frequencies commonly used to clean components such as 40 kHz up to 5 MHz.

It is important to note that for comparable sonication efficiencies, the power intensities that are seen in megasonic transducers are generally 10 to 50 times lower than those used in ultrasonic transducers. Unlike lower frequency ultrasonics that rely on transient cavitations for sonication, the higher frequencies used in megasonics result in a higher pressure wave that is created in solution rather than bubbles. The reason for the increased efficiency using megasonics lies in the mechanism for a particle detaching from the surface. The high-pressure waves push and pull at particles that are dislodged on a surface at a rate of approximately 800,000-100,000 times/s. In this regard, megasonic sonication offers distinct advantages over ultrasonic due to the absence of transient cavitations. The absence of transient cavitations reduces the probability of material damage, cavitation induced component surface erosion of the component causing elevated particle counts, and mechanical stress.

In the above embodiment shown in FIG. 1A, the transducer 140 is mechanically separate from the extraction vessel 112. By decoupling the transducer 140 from the extraction vessel 112, if the extraction vessel 112 is changed, the transducer 140 need not be changed. Because the transducer 140 is decoupled from the extraction vessel 112, power from the transducer 140 is transmitted to the extraction vessel 112 through the fluid bath 136. Therefore, the transducer 140 provides indirect acoustic energy to the extraction vessel 112. In other embodiments, the transducer 140 may be directly coupled to the outside of the extraction vessel 112. An advantage of coupling the transducer 140 to the outside of the extraction vessel 112 is that power from the transducer 140 is transmitted more directly to the extraction vessel 112. In other embodiments, the transducer 140 is directly bonded externally to the bottom of the extraction vessel 112. An advantage of mounting the transducer 140 onto the extraction vessel 112 is that the transducer 140 provides power directly to the measurement fluid 116. A disadvantage to placing the transducer 140 inside the extraction vessel 112 is that extra measures may be required to prevent the transducer 140 from contaminating the measurement fluid 116. In addition, if the extraction vessel 112 is a consumable item, the transducer 140 might also need to be a consumable item. In other embodiments, multiple transducers 140 may be used.

In the above embodiment, the volume of the extraction vessel 112 is 100 ml up to several liters. In the above embodiment, a purge process is provided by flowing measurement fluid 116 from the source 144 and draining overflow measurement fluid 116 from the gutter 160 to the exhaust system 164. In another embodiment, all of the fluid 116 may be dumped from the extraction vessel 112 and then the extraction vessel 112 is rinsed and refilled. In another embodiment, a new clean extraction vessel 112 is used.

Figure 4A:
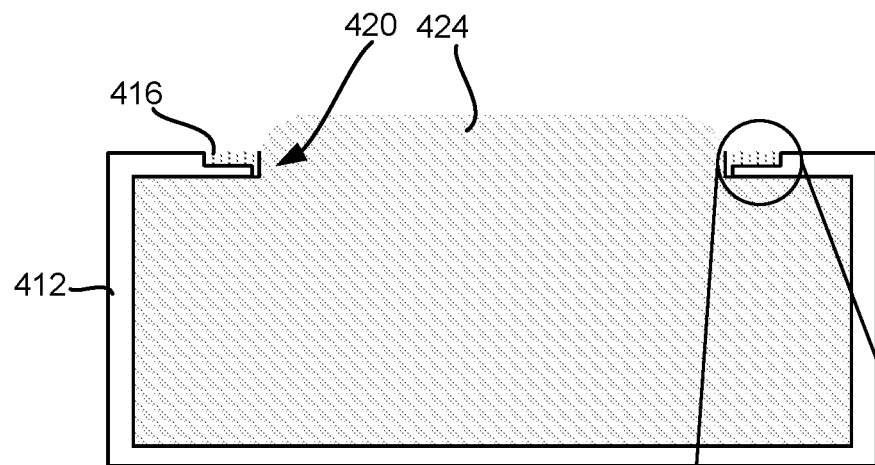
FIGS. 4A-B are schematic cross-sectional views of another embodiment.
Figure 4B:
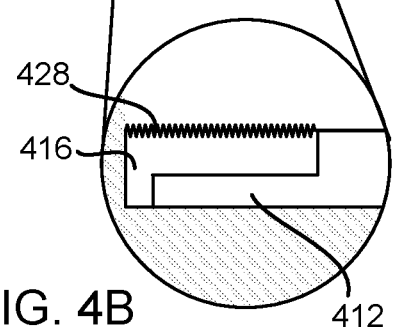

FIG. 4A is a more detailed schematic cross-sectional view of another embodiment of an extraction vessel 412. The extraction vessel 412 has an opening 420 that is stepped to accommodate a collar 416. FIG. 4B is an enlarged schematic cross-sectional view of part of the collar 416. An upper surface 428 of the collar 416 is rough and hydrophobic. The meniscus 424 is confined by the collar 416. The rough hydrophobic upper surface 428 of the collar 416 helps confine a break-down of the meniscus 424. In various embodiments, the collar 416 is formed from virgin polytetrafluoroethylene (PTFE). In this embodiment, the upper surface 428 has a roughness (RA) of at least >1 microinch. The upper surface 428 of the collar 416 provides an extraction vessel 412 surface around the opening 420 that is hydrophobic.

Figure 5:
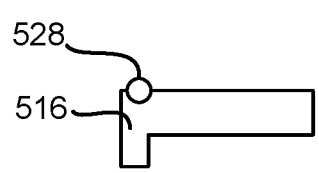
FIG. 5 is a schematic cross-sectional view of part of a collar of another embodiment.

FIG. 5 is a detailed schematic cross-sectional view of part of a collar 516 used in another embodiment. In this embodiment, an O-ring 528 is placed around an inner aperture formed by the collar 516. In this embodiment, the O-ring 528 is formed from a hydrophobic material, such as a perfluoroelastomer compound. Break-down of the meniscus 424 and eventual loss of fluid contact due to compression of the meniscus 424 in the z-direction will be controlled by the hydrophobic O-ring 528 around the meniscus 424.

Figure 6:
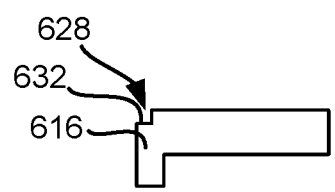
FIG. 6 is a schematic cross-sectional view of part of a collar of another embodiment.

FIG. 6 is a detailed schematic cross-sectional view of part of a collar 616 used in another embodiment. In this embodiment, a notch 628 is placed around an inner aperture formed by the collar 616, in order to form a step 632. Break-down of the meniscus 424 and eventual loss of fluid contact due to compression of the meniscus 424 in the z-direction will be controlled by the stepped region formed by the notch 628 around the meniscus 424, and the z-motion controls of the vessel actuator. The collar 616 can be modified to include features such as a step or recess or recessed hydrophobic confinement rings such that when the meniscus 424 is bound in between the component 104 and the extraction vessel 112, the meniscus 424 remains stable. The different embodiments of the collar 416, 516, 616 provide different embodiments of a meniscus confinement collar. All of these embodiments and additional embodiments provide a meniscus confinement collar that is able to increase the meniscus height and/or reduce the breakdown of the meniscus 424 while providing megasonic and/or ultrasonic energy.

In various embodiments, the extraction vessel opening may be shaped or conditioned to create a more convex meniscus 124. The extraction vessel 112 design can be optimized for fluid transport, short resident time to minimize extracted particle loss. For example, the extraction vessel 112 at the edge of meniscus 124 is treated to be hydrophobic. Alternatively, the extraction vessel opening is designed with a step feature forming a confinement ring at the opening, in order to confine the fluid and the meniscus boundary. The dimensions and the shape of the extraction vessel opening can be optimized to maximize extraction efficiency and meniscus confinement during static fill, component contact, and component withdrawal. In some embodiments, the measurement fluid 116 may be chosen to provide a more convex meniscus 124. However, the measurement fluid 116 cannot be a fluid that contaminates the critical surface 108. In various embodiments, the extraction vessel 112 is made of a material, such as glass, low particle level and trace metal plastics, or quartz. The material is chosen according to a desired cleanliness, meniscus shape, durability, and effective transmission of acoustic energy. In some embodiments, to increase the meniscus height, the extraction vessel 112 is made of a hydrophobic material, such as hydrophobic plastic surfaces (ie. high-density polyethylene (HDPE), low-density polyethylene (LDPE), and Polypropylene). Such hydrophobic plastic surfaces provide convex meniscus shapes at openings. The convex shape gives good height on the meniscus 124. The good height on the meniscus 124 provides improved confinement and gives more margin to position the meniscus 124 and component relative to one another.

In various embodiments, the top of the extraction vessel 112 may have a detachable nozzle to allow for changing the opening 120 geometry, shape, or height. The opening 120 may be changed to provide different locations for the opening 120 providing different contact locations with the critical surface 108. In other embodiments, different extraction vessels 112 would have different head or opening configurations allowing for flexibility in defining the contact area on the component 104. In addition, the different openings may be adapted to accommodate different shapes or materials of the critical surface 108.

In various embodiments, since the meniscus 124 has a height, the critical surface 108 does not need to be perfectly flat. Instead, a variation of the flatness of the critical surface 108 may be slightly less than the height of the meniscus 124. In various embodiments, the testing may be performed before the critical surface 108 is dried after a cleaning process. As a result, various embodiments provide faster throughput. In various embodiments, to provide faster throughput, several devices may be used in parallel to measure several locations of critical surfaces in parallel, or alternatively, the vessel and component actuator subsystems can be fully automated.

Figure 7:
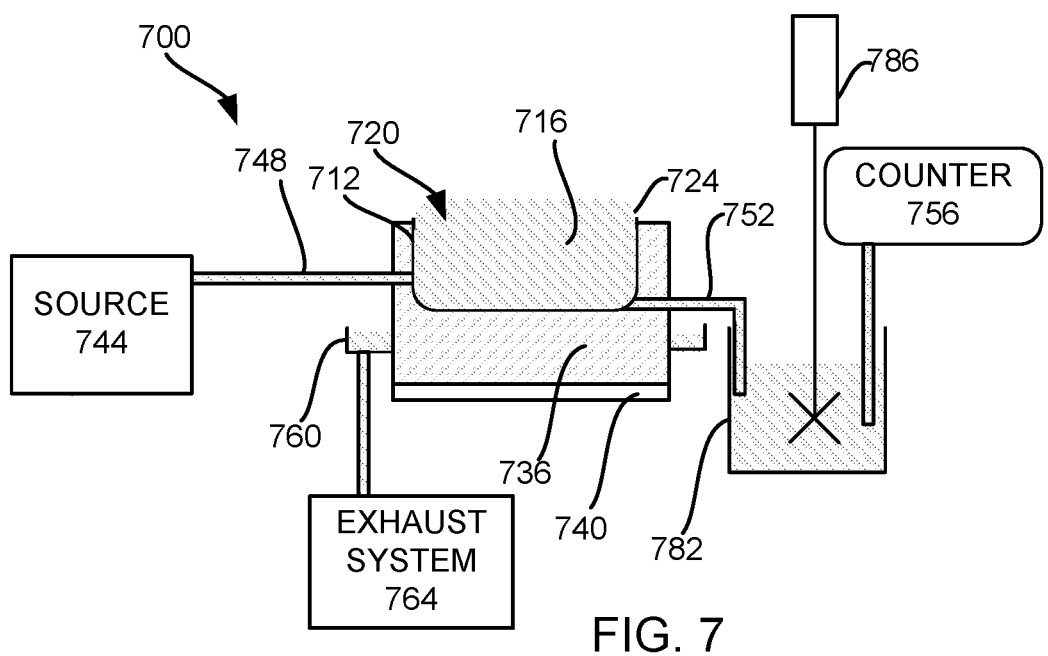
FIG. 7 is a schematic view of another embodiment.

FIG. 7 is a schematic view of another embodiment. In this embodiment, a measurement system 700 is used to measure cleanliness. An extraction vessel 712 is adapted to hold a measurement fluid 716. In this embodiment, the measurement fluid 716 is deionized water (DIW). The extraction vessel 712 has an opening 720 adapted to form a convex meniscus 724. In this embodiment, the extraction vessel 712 is in a fluid bath 736. A transducer 740 is in the fluid bath 736.

A measurement fluid source 744 is pre-processed and provides clean measurement fluid 716 to the extraction vessel 712 through an input line 748. A measurement line 752 draws measurement fluid 716 from the extraction vessel 712 and provides the measurement fluid 716 to a sampling collection vessel 782. A liquid particle count scan analysis counter device (liquid particle counter (LPC) device) 756 is in fluid connection with the sampling collection vessel 782 in order to measure the concentration of contaminants of the liquid in the sampling collection vessel 782. The overflow of measurement fluid 716 from the extraction vessel 712 is collected in a gutter 760. Measurement fluid 716 from the gutter 760 is provided to an exhaust system 764. A stirring device 786 is placed in a position to agitate fluid in the sampling collection vessel 782. In this embodiment, the sampling collection vessel 782 is a low particle and low trace metal bottle, such as Nalgene®. The sample is collected in the sampling collection vessel 782 for each run and analyzed by the LPC device 756. In this embodiment, the sampling collection vessel 782 is a consumable. With each test, a new sampling collection vessel 782 is provided. In an embodiment, after power is provided by the transducer 740 or while power is provided, measurement fluid 716 is flowed from the extraction vessel 712 to the sampling collection vessel 782.

In different embodiments, different parameters of the power from the transducer 740 in addition to frequency may be used to control the testing. For example, power amplitude, wattage, time, frequency of the sound wave, and duty cycle may be used as control parameters. In addition, the temperature of the liquid may be used as another control parameter. In an embodiment, 1 to 500 watts at a frequency of 40 kHz to 5 MHz, may be provided at a power density of 1 to 50 watts/in$^2$. In addition, different pulsing sequences may be used.

Figure 8:
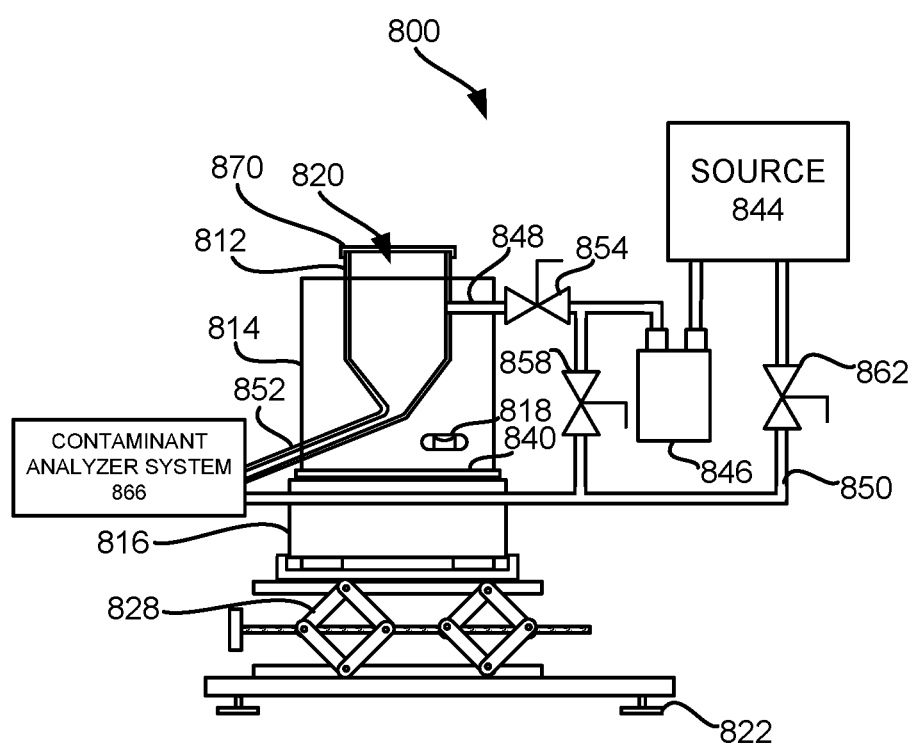
FIG. 8 is a schematic view of another embodiment.

FIG. 8 is a schematic view of another embodiment. In this embodiment, a measurement system 800 is used to measure cleanliness. An extraction vessel 812 is adapted to hold a measurement fluid. In this embodiment, the measurement fluid is deionized water (DIW). The extraction vessel 812 has an opening 820 adapted to form a convex meniscus. In this embodiment, the extraction vessel 812 is in a fluid bath vessel 814. A transducer 840 is mechanically connected to the fluid bath vessel 814.

A fluid bath vessel holder 816 holds the fluid bath vessel 814. The fluid bath vessel holder 816 is held by a jack 828, where the jack 828 acts as an actuator for moving the fluid bath vessel 814 vertically. The jack 828 is designed to vertically move the fluid bath vessel 814 without tiling the fluid bath vessel 814. In this embodiment, a leveling system comprising a level gauge 818 and level adjusters 822 is used to adjust the level of the fluid bath vessel 814, the extraction vessel 812, and the resulting meniscus. In this embodiment, the level gauge 818 is a bulb level. The level adjusters 822 are leveling feet. Other embodiments may use other level gauges 818 and other level adjusters 822 to provide a leveling system. For example, the leveling system may be automated to automatically keep the extraction vessel 812 level.

A measurement fluid source 844 is in fluid connection with a bypass line 850 and an input of a filter 846. Output from the filter 846 is in fluid connection with the extraction vessel 812 and the bypass line 850. A first shut off valve 854 is between the output of the filter 846 and the extraction vessel 812 on an input line 848 between the filter 846 and the extraction vessel 812. A second shut off valve 858 is between the output of the filter 846 and the bypass line 850. A third shut off valve 862 is between the measurement fluid source 844 and the bypass line 850.

In this embodiment, the extraction vessel 812 has a conical bottom, with sloping sidewalls. At the bottom of the extraction vessel 812 is a measurement line 852. The measurement line 852 slopes downward and away from the extraction vessel. In this embodiment, both the measurement line 852 and the bypass line 850 are in fluid connection with a contaminant analyzer 866.

The contaminant analyzer 866 may be a sampling collection vessel 782 and LPC device 756, shown in FIG. 7 or only an LPC device 156, as shown in FIG. 1A. In other embodiments, the contaminant analyzer 866 may be an extraction adsorbent tube that could trap the contaminants and later be used in combination with thermal desorption gas chromatography-mass spectrometer (GC-MS) for example. In other embodiments, the contaminant analyzer 866 may be a series of in-line filter media that can trap particles of various sizes and later be analyzed individually with common analytical methods such as optical or laser microscopy, a gravimetric analyzer, or alternate spectroscopic systems such as scanning electron microscopy/energy dispersive X-ray spectroscopy (SEM/EDS), Fourier-transform infrared spectroscopy (FTIR), inductively coupled plasma mass spectrometry (ICP-MS), GC-MS, Raman spectroscopy, and time-of-flight secondary ion mass spectrometry (TOF/SIMS). The contaminant analyzer 866 may be connected to an exhaust system. The contaminant analyzer 866 may flow the measurement fluid to exhaust without analyzing the contaminants in order to flush the extraction vessel 812.

When the first shut off valve 854 is open and the second shut off valve 858 and the third shut off valve 862 are closed, then measurement fluid flows from the fluid source 844 through the filter 846 and through the first shut off valve 854 to the extraction vessel. From the extraction vessel 812 the measurement fluid may flow through the measurement line 852 to the contaminant analyzer 866. The conical bottom of the extraction vessel 812 and the downward sloping measurement line 852 cause contaminants that are too dense and too large to be suspended in the measurement fluid to be moved by a combination of gravity and fluid flow to the contaminant analyzer 866.

When the first shut off valve 854 and the second shut off valve 858 are closed and the third shut off valve 862 is open, the measurement fluid flows from the fluid source 844 to the bypass line 850 and then to the contaminant analyzer 866. Such a flow allows the measurements of contaminants in the measurement fluid directly from the fluid source 844. In addition, such a flow may be used to purge the fluid source 844.

When the first shut off valve 854 and the third shut off valve 862 are closed and the second shut off valve 858 is open, the measurement fluid flows from the fluid source 844 through the filter 846 to the bypass line 850 and then to the contaminant analyzer 866. Such a flow allows the measurements of contaminants in the measurement fluid after passing through the filter 846. In addition, such a flow may be used to purge the filter 846.

In this embodiment, a meniscus confinement collar 870 is placed over and around the opening 820 of the extraction vessel 812. The meniscus confinement collar 870 is of a shape and material that controls the shape of the meniscus.

Various embodiments are able to provide a compact system. A compact system is able to fit under a containment hood to prevent outside contaminants from interfering with measurements. Such a compact system may be placed on wheels in order to be moved to a component to be tested.

While this disclosure has been described in terms of several preferred embodiments, there are alterations, modifications, permutations, and various substitute equivalents, which fall within the scope of this disclosure. It should also be noted that there are many alternative ways of implementing the methods and apparatuses of the present disclosure. It is therefore intended that the following appended claims be interpreted as including all such alterations, modifications, permutations, and various substitute equivalents as fall within the true spirit and scope of the present disclosure.

What is claimed is:

1. An apparatus for measuring contaminants on a surface of a component, comprising:
   an extraction vessel for holding a measurement fluid, wherein the extraction vessel has an opening adapted to form a concave meniscus using the measurement fluid, wherein the opening is smaller than a side of the surface of the component;
   an actuator for moving at least one of the extraction vessel and the component to a position where the meniscus is in contact with the surface of the component, wherein the measurement fluid does not contact an entire side of the surface of the component;
   a contaminant analyzer adapted to measure contaminants in the measurement fluid, wherein the measured contaminants are used to determine a level of cleanliness of the component; and
   a transducer positioned to provide acoustic energy to the measurement fluid.

2. The apparatus, as recited in claim 1, wherein the transducer is adapted to provide at least one of ultrasonic and megasonic energy.

3. The apparatus, as recited in claim 2, wherein the transducer is immersed in a bath and the bath is in contact with the extraction vessel.

4. The apparatus, as recited in claim 1, further comprising a measurement line extending from the extraction vessel.

5. The apparatus, as recited in claim 1, further comprising an input line adapted to flow clean measurement fluid into the extraction vessel.

6. The apparatus, as recited in claim 1, further comprising a gutter for catching overflow measurement fluid.

7. The apparatus, as recited in claim 1, wherein the transducer is positioned to indirectly apply acoustic energy to the measurement fluid.

8. The apparatus, as recited in claim 1, wherein an extraction vessel surface adjacent to the opening of the extraction vessel is hydrophobic or modified to confine a meniscus boundary.

9. The apparatus, as recited in claim 8, wherein the opening further comprises a meniscus confinement collar configured to form part of the extraction vessel surface.

10. The apparatus, as recited in claim 1, wherein the surface of the component is a critical surface of the component.

11. The apparatus, as recited in claim 1, wherein the meniscus does not contact the entire critical surface on a side of the component.

12. The apparatus, as recited in claim 1, wherein the extraction vessel does not contact the surface of the component.

13. The apparatus, as recited in claim 1, wherein the transducer is directly coupled to the extraction vessel.

14. A method for measuring contaminants on a surface of a component, comprising:
   a) filling an extraction vessel with measurement fluid;
   b) forming a concave meniscus using the measurement fluid at an opening in the extraction vessel, wherein an opening of the extraction vessel is of a material that causes a formation of a concave meniscus for the measuring fluid, wherein the opening is smaller than a side of the surface of the component;
   c) contacting at least one location on the surface of the component with the meniscus, wherein the measurement fluid does not contact an entire side of the surface of the component;
   d) providing acoustic energy to the measurement fluid from a transducer; and
   e) measuring an amount of contaminants in the measurement fluid by a contaminant analyzer.

15. The method, as recited in claim 14, further comprising measuring an initial amount of contaminants in the measurement fluid before contacting at least a location on the surface of the component with the meniscus.

16. The method, as recited in claim 14, further comprising repeating steps a) and b), contacting at least another location on the surface of the component with the meniscus, and repeating steps d) and e).

17. The method, as recited in claim 14, wherein the providing acoustic energy comprises providing ultrasonic or megasonic energy at a single frequency.

18. The method, as recited in claim 14, wherein the providing acoustic energy comprises providing ultrasonic or megasonic energy at two or more frequencies.

19. The method, as recited in claim 14, wherein the surface of the component is a critical surface, and wherein the meniscus does not contact any non-critical surface of the component.

20. The method, as recited in claim 14, wherein the surface of the component does not contact the extraction vessel.

21. The method, as recited in claim 14, wherein the concave meniscus extends above a top edge of the opening of the extraction vessel.

22. The apparatus, as recited in claim 1, wherein the concave meniscus extends above a top edge of the opening of the extraction vessel.

* * * * *